(12) United States Patent
Affolter

(10) Patent No.: US 6,249,440 B1
(45) Date of Patent: Jun. 19, 2001

(54) CONTACT ARRANGEMENT FOR DETACHABLY ATTACHING AN ELECTRIC COMPONENT, ESPECIALLY AN INTEGRATED CIRCUIT TO A PRINTED CIRCUIT BOARD

(75) Inventor: Hugo Affolter, Lengnau (CH)

(73) Assignee: E-TEC AG, Lengnau (CH)

( * ) Notice: Subject to any disclaimer, the term of this patent is extended or adjusted under 35 U.S.C. 154(b) by 0 days.

(21) Appl. No.: 08/952,682
(22) PCT Filed: May 10, 1996
(86) PCT No.: PCT/EP96/01987
§ 371 Date: Nov. 25, 1997
§ 102(e) Date: Nov. 25, 1997
(87) PCT Pub. No.: WO96/38030
PCT Pub. Date: Nov. 28, 1996

Related U.S. Application Data

(63) Continuation of application No. 08/539,158, filed on Oct. 4, 1995.

(30) Foreign Application Priority Data

May 26, 1995 (EP) .................................................. 95810352

(51) Int. Cl.$^7$ ..................................................... H05K 7/02
(52) U.S. Cl. .......................... 361/769; 361/760; 361/761; 361/770; 361/783; 361/807; 361/809; 361/820; 439/70; 439/71; 257/718; 257/785; 257/678; 257/688
(58) Field of Search .................. 439/70, 71; 361/769, 361/715, 761, 776, 783, 820, 770, 809, 760, 807; 257/718, 785, 678, 688

(56) References Cited

U.S. PATENT DOCUMENTS 4,508,405 4/1985 Damon et al. .

(List continued on next page.)

FOREIGN PATENT DOCUMENTS 2715056 10/1978 (DE) .

(List continued on next page.)

OTHER PUBLICATIONS

Ball Grid Array SMD Production Socket, E–tec, May 2, 1997.*

(List continued on next page.)

Primary Examiner—Leo P. Picard
Assistant Examiner—David Foster
(74) Attorney, Agent, or Firm—Pillsbury Madison & Sutro LLP

(57) ABSTRACT

The contact arrangement is a connector block for detachably fastening an electrical component, particularly an integrated circuit having a plurality of terminal contacts disposed in a ball grid array (BGA), in a column grid array (CGA), in a land grid array (LGA) or of the flip-chip type to a printed circuit board. In a support part, a number of contact pins are disposed in a grid in bores. The contact pins project from the bore on the side facing the printed circuit board and are surface-mounted together with contact areas of the printed circuit board. A free end region of each bore is intended for guiding the substantially dome-shaped terminal contacts. Between the end of a contact pin and a terminal contact there is a space bridged for establishing an electrical connection with a contact element, for example an axially compressible coil spring. By means of several holding-down elements disposed peripherally to the integrated circuit, the integrated circuit is pressed down upon the support part. Even with a plurality of terminal contacts, a faultless electrical contact is achievable between the terminal contacts and the associated contact pins with a holding-down force which is relatively small. This particularly because with the contact arrangement according to the invention, no axially acting frictional forces need be overcome for establishing the contact.

22 Claims, 6 Drawing Sheets

U.S. PATENT DOCUMENTS

| | | |
|---|---|---|
| 4,620,761 | 11/1986 | Smith et al. . |
| 4,642,889 | 2/1987 | Grabbe . |
| 4,729,166 | 3/1988 | Lee et al. . |
| 4,904,213 | 2/1990 | Hock et al. . |
| 4,922,376 | 5/1990 | Pommer et al. . |
| 5,076,794 * | 12/1991 | Ganthier ................................ 439/70 |
| 5,321,583 | 6/1994 | McMahon . |
| 5,376,010 | 12/1994 | Peterson . |
| 5,431,571 * | 7/1995 | Hanrahan et al. ..................... 439/91 |
| 5,500,605 | 3/1996 | Chang . |
| 5,518,410 * | 5/1996 | Masami ................................. 439/71 |
| 5,561,594 * | 10/1996 | Wakefield ............................. 439/66 |
| 5,611,696 * | 3/1997 | Donner et al. ........................ 439/66 |
| 5,702,255 * | 12/1997 | Murphy et al. ....................... 439/71 |
| 5,730,620 * | 3/1998 | Chan et al. ......................... 439/526 |
| 5,766,021 * | 6/1998 | Pickles et al. ........................ 439/70 |

FOREIGN PATENT DOCUMENTS

| | | |
|---|---|---|
| 3832410 | 4/1989 | (DE) . |
| 105628 | 4/1984 | (EP) . |
| 360485 | 3/1990 | (EP) . |
| 2214179 | 8/1974 | (FR) . |
| 2635616 | 2/1990 | (FR) . |
| 1493554 | 11/1977 | (GB) . |

OTHER PUBLICATIONS

Patent Abstract of Japan, Toshiyuki, Anisotropic Conductive Connector and Its Manufacture, Pub. No. JP1097382, Apr. 1989, vol. 13, No. 338.

Patent Abstract of Japan, Toshio, "Socket for LSI Package", Pub. No. 8203644, Aug. 1986., Neumann et al., Electrically Conductive Array in an Elastomeric Material, IBM Tech. Discl. Bull., v25, n4, pp. 1801–1802, Sep. 1982.*

Mace et al., Customable Multi–Contact–Pointer Interposer, IBM Tech. Discl. Bull., v37, n4B, pp. 105–106, Apr. 1994.*

* cited by examiner

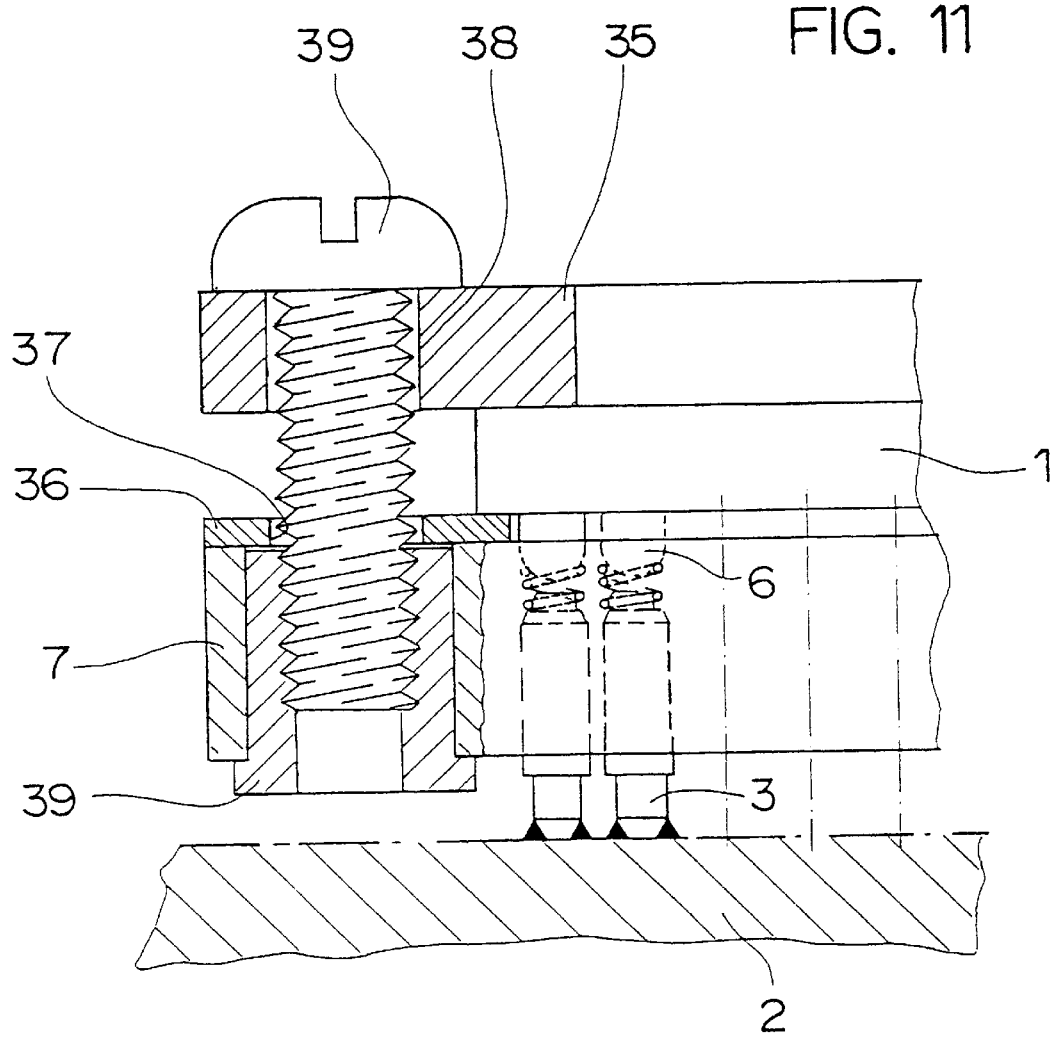

CONTACT ARRANGEMENT FOR DETACHABLY ATTACHING AN ELECTRIC COMPONENT, ESPECIALLY AN INTEGRATED CIRCUIT TO A PRINTED CIRCUIT BOARD

This application is the national phase of international application PCT/EP96/01987, filed May 10, 1996 which designated the U.S., which in turn, claims the benefit of European Application No. 95810352.5, filed May 26, 1995 and U.S. application Ser. No. 08/539,158, filed Oct. 4, 1995.

BACKGROUND OF THE INVENTION

The present invention relates to a contact arrangement for detachably attaching an electrical component having a plurality of terminal contacts, for example an integrated circuit of the BGA-type (ball grid array), of the CGA-type (column grid array), of the LGA-type (land grid array) or of the flip-chip type, to a printed circuit board, having a number of electrically conductive contact pins which are directly attachable to the printed circuit board, and which, attached state, extend away from the printed circuit board at approximately right angles, each of the contact pins being connected to at least one conductor path of the printed circuit board for establishing an electrical connection. The present invention further relates to the board-to-board correction between two printed circuit boards.

The technologies and processes for producing integrated circuits have been constantly improved in the last few years. There is no end in sight of the technical advance in this field. The constant further developments have led to the integrated circuits becoming increasingly larger and more complex. Starting from single electronic basic components integrated on a chip, such as transistors, diodes, resistors, etc., integrated circuits have been fabricated which contain countless thousands of basic components. A great problem that had to be solved with the increase in complexity of the integrated circuits, and must be newly solved or improved again and again, is the leading-out of the electrical terminals. The number of such terminals has become no longer limited to just a few but today may easily already be provided in a plurality on the order of magnitude of over 600.

Such LSI circuits, for example arithmetic units in computer technology, may also be considerably expensive. Connector blocks have therefore been created which are soldered to the conductor paths of a printed circuit board instead of the integrated circuit. A connector block has contact arrangements formed in such a way that an integrated be pluggably connected to the connector block. In this way, the highly complex integrated circuit is exchangeable at any time. In particular, when replacing such an integrated circuit having very many terminals, one does not run the risk of destroying the conductor paths of the printed circuit board with the multitude of other electronic components disposed thereon, through a desoldering operation which is not easy to accomplish because of the many terminals. There are integrated circuits formed substantially as rectangular plates. On a typical one of these, the electrical terminals are disposed along the side surfaces of the plate. Such integrated circuits can be plugged into a frame-shaped connector block. There, there is a spring contact-lug for each terminal of the integrated circuit. This kind of connector block is provided for the mounting of integrated circuits corresponding to the PLCC construction form.

In another type of highly complex integrated circuits, their terminals are led out in pin form on the underside of the housing. These are integrated circuits with terminals disposed in a so-called pin grid array (PGA). Connector blocks for these provide contact pins disposed in a plastic slab corresponding to the grid of the terminal pins of the integrated circuit. The contact pins are essentially formed as jacks which on one side can be plugged into a hole mask on the printed circuit board and soldered to the conductor paths there and on the other side have contact springs inside each jack for ensuring a faultless electrical contact with the contact pin to be received.

These two kinds of connector blocks have the disadvantage that particularly in the case of integrated circuits having very many electric terminals, considerable force must be expended for inserting the integrated circuit in the connector block and for removing the circuit from the connector block. The danger that the integrated circuit is destroyed as a result is not negligible.

Nor is it particularly easy, furthermore, especially with the second-mentioned type of known connector block, to center on the contact pins an integrated circuit to be inserted. It occurs relatively frequently that in the case of poor centering, terminal pins of the integrated circuit are bent over and break off when straightened.

The design of the LSI circuits has likewise been adapted to the art of surface mounting technology (SMT). Thus, for this purpose, the terminals of an integrated circuit disposed in a grid array, for example, have no longer been made pin-shaped but have been made substantially spherical-segment-shaped. To that end instead of a pin, there protrudes from the underside of the housing of the integrated circuit for each terminal a part-spherically curved segment, preferably, a hemisphere. The terminal arrangement of thus integrated circuits is known by the term ball grid array (BGA). The dome-shaped terminals of such integrated circuits, during attachment of the latter to a printed circuit board, are soldered directly to contact areas of the printed circuit board. In case of subsequently perceived non-functioning or faulty functioning of a thus attached integrated circuit, the latter can be removed and replaced by another integrated circuit only with very great expenditure and with the constant danger of destroying the printed circuit board. The failure rate of printed circuit boards which can then no longer be used through such an operation is correspondingly great.

SUMMARY OF THE INVENTION

It is the task of the present invention to provide a contact arrangement, especially a connector block, which permits disposing this last-mentioned kind of integrated circuits, too, exchangeably on a printed circuit board. At the same time, reliable contact-making is to be ensured for every terminal, even with an extremely great number of terminals, and nonetheless the force to be expended for inserting or removing the integrated circuit is to be so little that, in any case, destruction of the integrated circuit through too great actions of force can be excluded.

According to the invention, this task is solved with a contact arrangement for detachably attaching an electrical component having a plurality of terminal contacts on a printed circuit board in that the contact pins are made in one piece, that between each contact pin and a therewith associated terminal contact of the assembled component and/or between each contact pin and a therewith associated conductor path of the printed circuit board there is a space extending away from the free end of the contact pin, and that for establishing an electrical connection with the terminal contact of the component and/or with the conductor path of the printed circuit board, the space is bridged by a compressible, electrically conductive contact element.

This solution has the advantage, for one thing, that manufacture of the contact pins, since they are made in one piece, is relatively simple and cost-effective. Since the compressible or resilient contact element is substantially simply placed upon the free end of the contact pin facing a terminal contact of the integrated circuit and acts in axial direction, no socket-shaped recesses with any inserted spring elements are necessary in the contact pin itself. The outside diameters of the contact pins can accordingly be kept relatively small, so that the grid dictated by the terminal contacts of the integrated circuit may be maintained without any problems worth mentioning. The substantially dome-shaped terminal contact of the integrated circuit opposite each contact pin likewise acts merely in an axial direction on the compressible contact element. As compared with the earlier pin arrangements, no lateral frictional forces necessary for pressing the circuit into a connector block are produced on the terminal contacts of the integrated circuit. The force necessary for inserting the integrated circuit in the contact arrangement according to the invention is determined merely according to the number of terminal contacts and the force necessary for compressing the contact element which extends away from each contact pin end. This force is relatively slight, as compared with that necessary for inserting integrated circuits having terminal pins in a corresponding connector block. It has turned out that contact-making is faultless, even when the underside of the housing of the integrated circuit is not absolute plane or not all the dome-shaped terminal contacts are identically formed and protrude the same distance from the underside of the integrated circuit. This may very well be the case, for example, after tin-plating of the terminal contacts.

As already stated, an integrated circuit is preferably intended as an electrical component. However, the invention shall not be limited thereto but rather also be accessible to other electrical components having a similar terminal contact arrangement, if any.

The present invention applies in particular to components, the terminal contacts of which are disposed in a ball grid array (BGA), in a column grid array (CGA), in a land grid array (LGA). The inventive idea further extends to flip-chips or to the interconnection between two printed circuit boards.

It has been found in thorough tests that the compressible, electrically conductive contact element is preferably a coil spring, one coil spring being provided per contact pin. This spring can be fastened to the contact pin in a relatively simple manner in that an extension is turned on the end of the latter, over which the contact spring can be pressed on. Then, in an electroplating process, the contact pin and the coil spring together can be coppered and thereafter tinned, for example. The coil spring then remains held on the end of the contact pin after this operation through the additional metal coating.

A further referred embodiment provides using for the compressible, electrically conductive contact element, a rubber-elastic mat in which fine, gold-plated metal wires are embedded, spaced close together. The rubber-elastic mat may be made of a silicone rubber. Such mats are commercially available and may be procured, for example, through the Japanese firm SHIN-ETSU.

The thickness of these mats is between 0.3 and 1 mm, and the mutual spacing of the metal wires which penetrate the thickness of the mat, and are cut off about plane with the mat faces on both sides, amounts to 0.05 to 01 mm.

It is preferably provided that the mat for the present application be cut to size in such a way that it corresponds at least to the lateral dimensions or to the shape of the underside of the housing of the electrical component and thus covers all terminal contacts of the latter.

The ends of the contact pins over which the mat is placed are fashioned in such a way that several of the fine metal wires are contacted by the front face of the contact pin. It has turned out that for this purpose, the end of the contact pin is preferably made slightly dished, with an annular, not sharp-edged dish rim, or designed approximately as a crown-shaped structure comprising several non-sharp-edged teeth. Of course, other designs of the ends of the contact pins, not described in detail here, are also possible. It would be conceivable, for example, to combine these. In this way, it may be ensured that through several, but at least through one metal wire, contact-making is reliably produced between the end of the contact pin and the terminal contact of the electrical component which lies on the side of the mat remote from the contact pins.

A preferred embodiment further provides that the contact pins of the contact arrangement may be disposed in a plate-shaped support part which may be made of an epoxy material or of a thermoplastic synthetic material. Advantageously, the contact pins are inserted in bores of the plate-shaped support part, some of the contact pins facing the printed circuit board projecting from the support part and being formed by one of the known connection techniques with the printed circuit board, for example as a solder pin, or for SMD assembly. The end of the contact pins facing the electrical component does not project from the plate-shaped support part but ends in the bore, set back relative to the surface of the support part. It is thereby achieved that the uppermost region of each bore in the support part made of an electrically insulating material serves as a guide for the associated terminal contact of the electrical component. Depending upon the chosen diameter of the bores or of the guide region of the bores, it is achieved that the terminal contacts can penetrate deeper or less deep. It may be provided that the terminal contacts can penetrate into the bores so far that the underside of the component rests on the top of the support part. The spacing between the contact pins and the terminal contacts is always present, however, independently of the penetration depth. Reliable contact-making of the terminal contacts of the electrical component with the contact pins via the compressible contact elements does not take place until the electrical component to be put on has been correctly centered and then pressed down. Incorrect or slanting insertion is avoided by the guiding effect of the bore ends.

In the embodiment with the rubber-elastic mat, the support part is divided into two superimposed plates, the rubber-elastic mat being disposed between the two plates. The contact pins are contained in the bores of one plate and substantially project just barely beyond the surface facing the other plate. The bores of the other plate are empty and serve as guides for the dome-shaped terminal contacts of the electrical component. The two plates of the support part with the compressible mat lying between them are, for example, screwed together, riveted, or joined to one another in some other common way.

Advantageously, it is provided that the contact pins be pressed into the bores. They are thereby held securely in the latter.

The contact arrangement according to the invention likewise includes a holding-down device for pressing the terminal contacts of the electrical component down on the coil springs or the rubber-elastic mat. The holding-down device is made removable from the contact arrangement and is placed on the contact arrangement after the electrical component is put in place and produces on the top of the housing of the electrical component a force directed substantially perpendicular to the printed circuit board. The compressible electrical contact elements, the coil springs or the rubber-elastic mat with the fine metal wires, are thereby compressed between the terminal contacts of the electrical component and the contact pins opposite them, and the electric contact-making between the terminal contacts and the contact pins is produced.

The holding-down device may be formed either as a spring which, when inserted, presses on the electrical component, or it may comprise non-spring holding-down elements which may be screwed onto the printed circuit board or the support part, in which case a tab present on each holding-down element presses on the top of the component. In order that the overall height of the holding-down elements need not be adapted accordingly to the thickness of the electrical component, it is conceivable to dispose an adjustment means in the pressing-down tab, for example a setscrew, by which the force acting on the top of the electrical component can be adjusted.

The holding-down device may additionally also be formed in such a way that it comprises additional guide means for guiding the electrical component along its lateral faces.

By means of the design devised, it is possible to make the contact arrangement very small, Thus, for example, the distance from one edge of the support part to the nearest contact pin is at most 5.2 mm. The overall height of the connector block formed by the support part with the inserted contact pins likewise amounts merely to 4.1 mm at most. These small dimensions have an extremely advantageous effect with the crowded mode of construction of electronic assemblies.

BRIEF DESCRIPTION OF THE DRAWINGS

With the aid of figures and exemplary embodiments, the present invention is described in detail below.

FIG. 11 is a further embodiment of a holding-down device, shown in a partial view in section.

DETAILED DESCRIPTION

Figure 1:
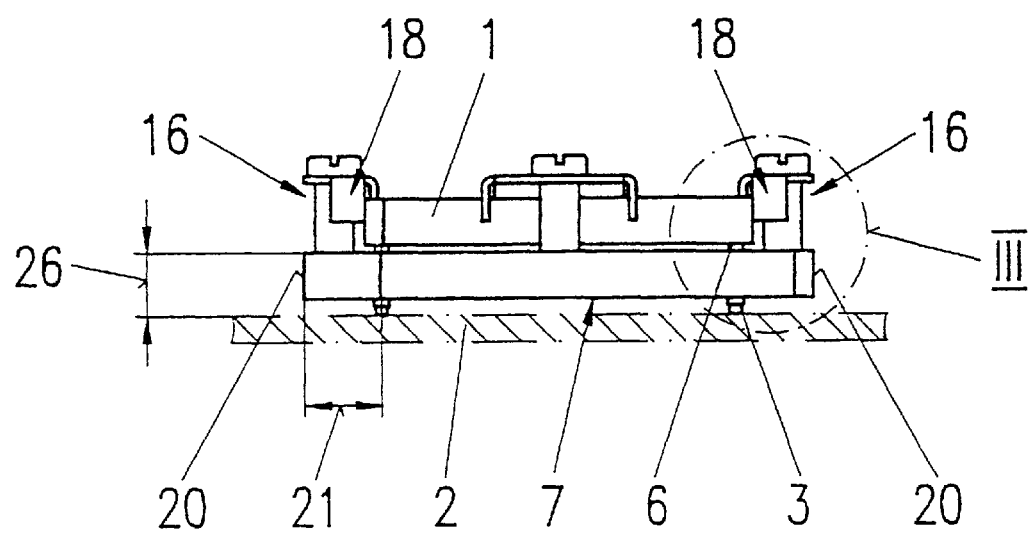
FIG. 1 shows a side elevation of a first embodiment of a contact arrangement according to the invention.
Figure 2:
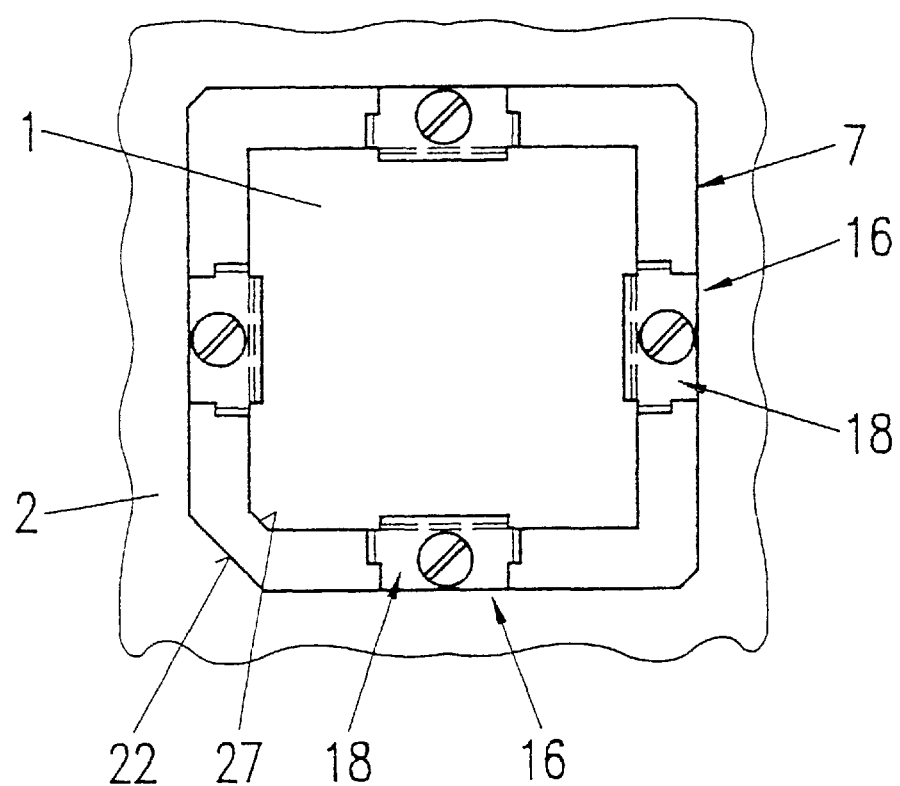
FIG. 2 shows a top plan view of the contact arrangement according to FIG. 1.
Figure 3:
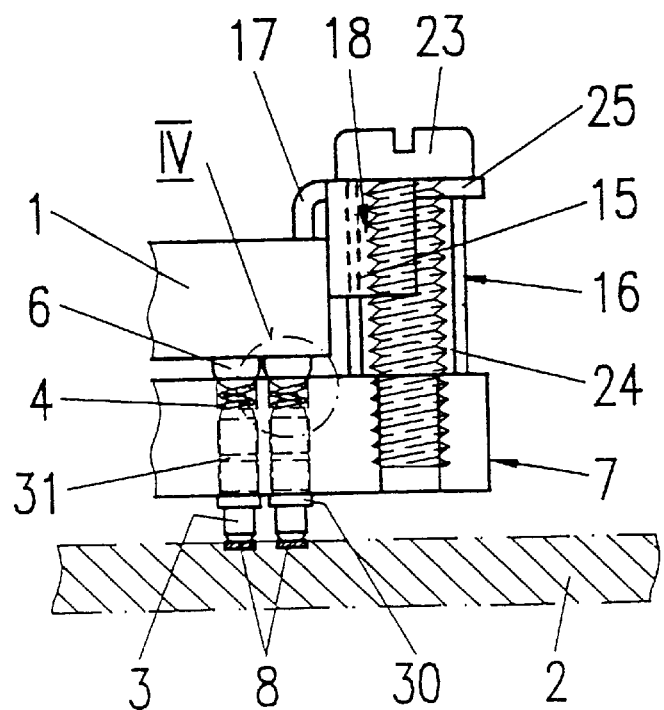
FIG. 3 shows the enlarged detail of this contact arrangement designated as III in FIG. 1.

In FIGS. 1, 2, 3, and 4, a first exemplary embodiment of a contact arrangement according to the invention is shown. In the figures in the reference number, 1 designates an electrical component, especially an integrated circuit, having terminal contacts 6 on its lower side, i.e. on the side facing a printed circuit board 2. The terminal contacts are distributed in a grid, substantially over the entire lower face of the electrical component. They are disposed in a network grid (grid array). Each terminal contact 6 has substantially the shape of a spherical segment, especially the shape of half a sphere, which stands out from the lower surface of the electrical component 1. The arrangement and shape of the terminal contacts are known by the name ball grid array (BGA). Let it be mentioned at this point just incidentally that it is not essential for the invention that the terminal contacts be distributed over the entire lower side of the housing of the electrical component. Thus, for example, embodiments are also contemplated in which the terminal contact merely form a wreath, in which case there is a contact-free area in the center of the integrated circuit.

In the exemplary embodiment shown, there are substantially cylindrical contact pins 3, one contact pin each being inserted in a bore 13 which goes through a plate-shaped support part 7 along its thickness. Advantageously, the contact pins are pressed into the bores 13 from one side of the plate-shaped support part 7, the pressing-in path being limited by a stop ring 30 disposed encircling each contact pin 3. Each contact pin 3 has, in addition, about halfway along its length, an encircling, slightly protruding collar 31 having a slightly sloping outer surface. This collar serves to reinforce the press fit of the contact pin 3 in the bore 13.

On the side of the stop ring 30 remote from the support part 7, one end of the contact pins 3 is formed substantially as a cylindrical journal having an approximately plane end face. This is provided for being soldered fast to the surface of a contact point 8, especially a conductor path of the printed circuit board 2. This process has become known by the term surface mounting. The parts mounted in this way are generally called SMD (surface-mounted device) parts.

Whereas the contact pins 3 on the side facing the printed circuit board 2 protrude from the support part 7, on the other side of the support part 7 facing the electrical component 1 they are disposed set back in the bores 13. The end region 14 of each bore 13 thereby not penetrated by the contact pins 3 serves as a guide means for the terminal contacts 6 of the electrical component, or the integrated circuit 1, for positioning the latter relative to the entirety of the contact pins 3 forming the contact arrangement. The diameter of the end region 14 of the bore 13 can thereby be slightly smaller or slightly larger than the diameter of the terminal contact 6.

Figure 4:
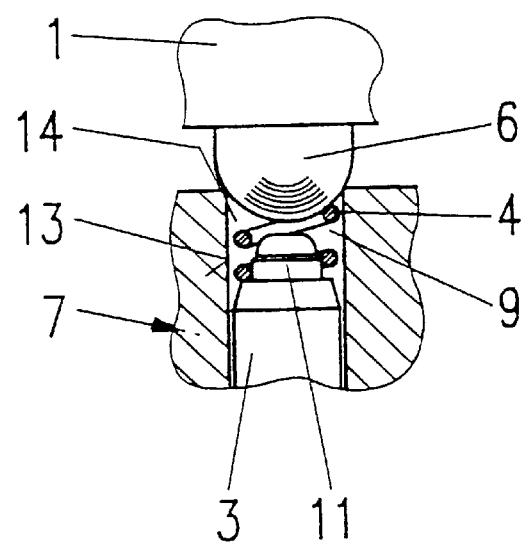
FIG. 4 shows the enlarged detail of this contact arrangement designated as IV in FIG. 3.
Figure 5:
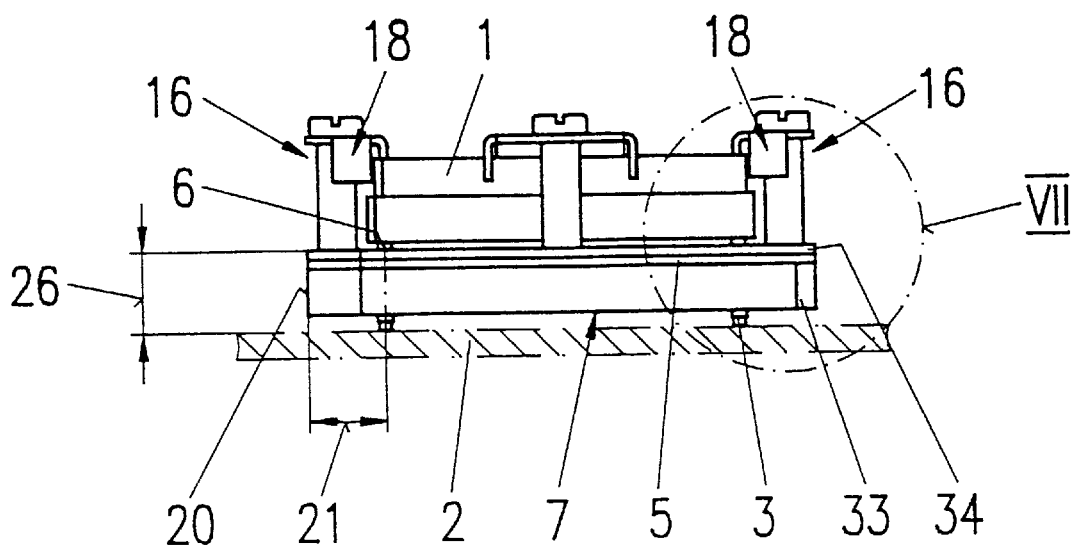
FIG. 5 shows a side elevation of a second exemplary embodiment of the contact arrangement according to the invention.
Figure 6:
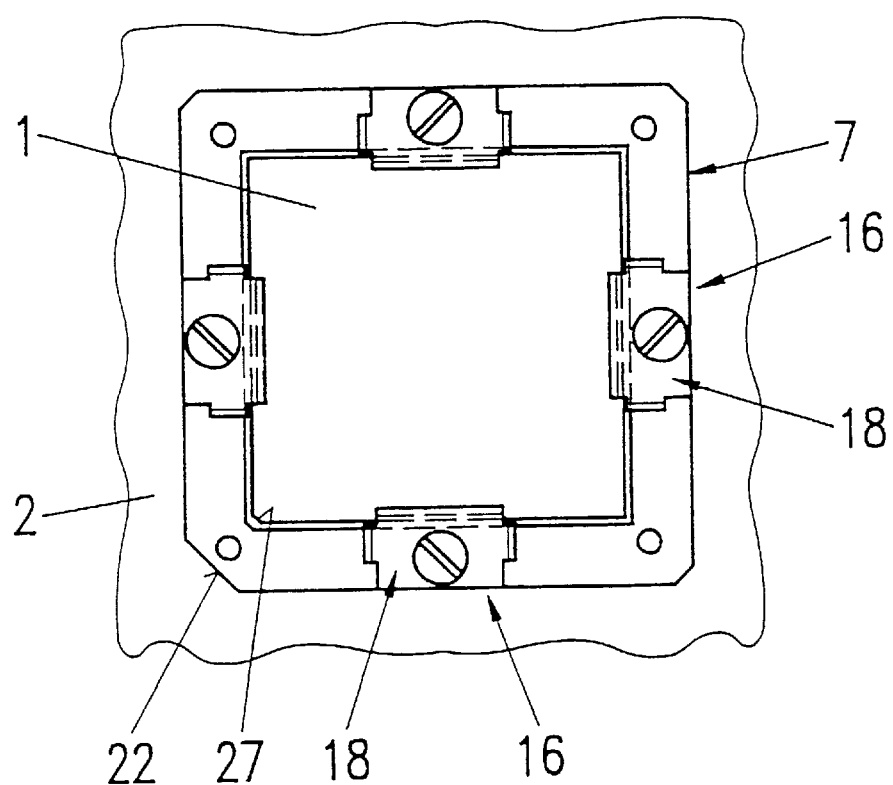
FIG. 6 shows a top plan view of the contact arrangement according to FIG. 5.
Figure 7:
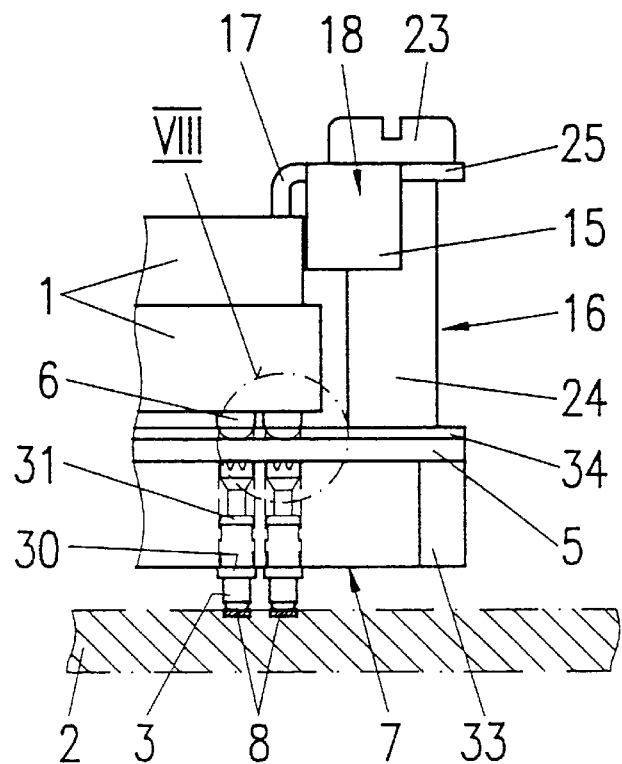
FIG. 7 shows the enlarged detail of this contact arrangement designated as VII in FIG. 5.
Figure 8:
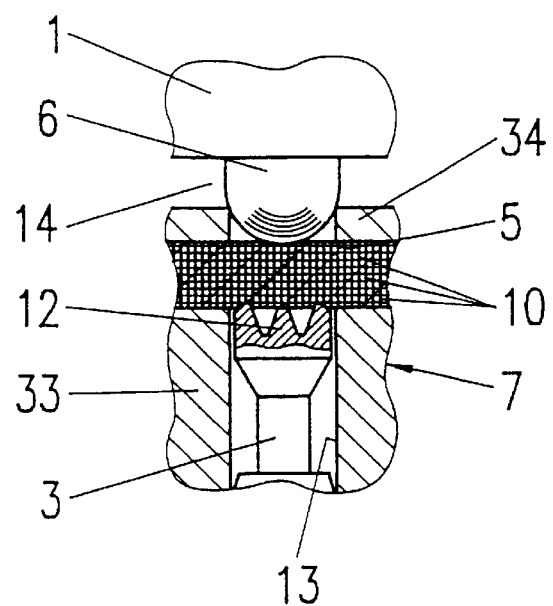
FIG. 8 shows the enlarged detail of this contact arrangement designated as VIII in FIG. 7.

The contact pins 3 extend in the soldered state approximately at right angles from the printed circuit board 2. The electrical component 1 is now placed on the plate-shaped support part 7 in such a way that its terminal contacts 6 project from above into the end regions 14 of the bores 13. There is then a space between the bottom end of each terminal contact 6 and the top of the associated contact pin 3. This space is designated by the reference numeral 9 (FIG. 4). A compressible contact element 4, 5, in the first exemplary embodiment shown a coil spring 4 of electrically conductive material, bridges the space between the contact pin 3 and the terminal contact 6. Prior to the insertion in a bore 13 of a contact pin 3, the coil spring 4 been placed on the latter as described in the introduction of the description. For that purpose, each contact pin 3 has an appropriately shaped extension 11 at the end remote from the printed circuit board 2.

The coil springs 4 are slightly compressed by the pressing of the terminal contacts of the electrical component 1 into the guide means providing end region 14 of the bores 13 and ensure faultless electrical connections between one terminal contact 6 and one contact pin 3 each, i.e., the respective contact area 8 of the printed circuit board 2. With the electrical component 1 removed, the free ends of the coil springs 4 are about flush with the surface of the plate-shaped support part 7. Even when the terminal contacts 6 are not carried out uniformly but protrude at varying distances from the underside of the electrical component, which may easily be the case through the tin-plating of the terminal contacts 6, a faultless electrical connection is ensured by the present design. Since no axial frictional forces act, the force for pressing the electrical component 1 into the guide means providing end regions 14 of the bores 13 is also possible with a reasonable expenditure of force, which is in any case so small that no destruction of an integrated circuit 1 can be brought about thereby.

In order that faultless contact-making between the terminal contacts 6 of the electrical component 1 and the contact pins 3 is permanently ensured, a holding-down device 16 is necessary. The latter sees to it that the electrical component 1, especially the integrated circuit, is pressed against the holding part 7 with a certain force. In the first exemplary embodiment shown, the holding-down device 16 comprises four holding-down elements 18, one holding-down element 18 being disposed about halfway along each side of the approximately square-formed integrated circuit. Each holding-down element 18 comprises a (fastening screw 23 screwed into a not specially depicted) bore of the support part 7. The fastening screw 23 passes through a spacer 24, one end face of which rests on the support part 7 and the other end face of which rests against a guiding or holding-down tab 25 which is clamped between the last-mentioned end face and the screw head of the fastening screw 23. The guiding and holding-down tab extends with one leg 17, the end of which is bent down, over the edge area of the top of the housing of the integrated circuit 1. With fastening screw 23 screwed tight, the bent-down end of the tab is intended as pressure means 17 to press the electrical component 1 down on the support part 7. Through the four holding-down elements 18 and the pressure means 17 associated with them, the integrated circuit 1 is uniformly pressed down from above about halfway along each one of its longitudinal sides onto the plate-shaped support part 7. Uniform contact-making of all terminal contacts 6 with the associated contact pins 3 is achieved in this way.

Each guiding and holding-down tab 25 further has guide means 15 which, in the exemplary embodiment shown, are formed as guide tabs bent down at right angles facing the support part 7. The guide tabs serve, besides the guide area 14 for the terminal contacts 6, to keep the electrical component 1 additionally guided on the support part 7.

The fastening screws 23 may be formed self-tapping, they may be cylinder-head screws which engage a thread of the support part 7, this thread also being reinforceable by a threaded bushing, for example of metal, inserted in the support part 7. It would be conceivable, too, that the fastening screws 23 are not screwed tight on the support part 7 but that they merely traverse the latter and co-operate analogously with a thread existing in the printed circuit board 2.

Instead of holding-down elements, a single holding-down frame is also foreseen, in accordance with FIG. 11, the inner frame edges lying on the upper surface of the electrical component 1 and pressing down thereon. This frame can be made of metal or preferably of a synthetic material. In this embodiment with the holding-down frame, an additional lateral guide for the electrical component 1 to the end regions 14 of the bores 13 can be achieved through a further frame 36 supported on support part 7. This leads to an initial positioning of the electrical component 1 when the electrical component 1 is placed on support part 7. On the outside, further frame 36 is preferably flush with support part 7. The area enclosed by the further frame 36 leaves open all end regions 14 of the bores 13. At least with part of its inner edge area, further frame 36 is pinched between support part 7 and the lower side of electrical component 1, and is thus held on the support part. Foreseen in further frame 36 are bores 37, which are congruent with bores 38 in holding-down frame 35. Led through these bores 37, 38 are fastening screws or respectively holding-down screws 39, which project into threaded linings 39 which have been put into support part 7. Achieved by means of the two frames 35, 36 is that the electrical component 1 in the area of its terminal contacts 6 is not greatly burdened, neither with respect to pressure nor with respect to bending. Thus avoided is overstress on the electrical component when screws 39 are screwed lower.

Further indicated in FIG. 1 by the reference numeral 21 is the given distance between a lateral edge 20 of the support part 7 and the nearest contact pin 3. This distance is small and amounts to at most 5.2 mm or about two times 1/10 of an inch according to the 1/10-inch grid customary in electronics.

Designated by the reference numeral 26 is the overall height of a connector block comprising the plate-shaped support part 7 in which the contact pins 3 are disposed. The connector block is raised by at most 4.1 mm relative to the surface of the printed circuit board 2 on which it is disposed.

The reference numeral 22 designates a marking bevel or marking facet made on the support part 7 in order to establish thereby the placement direction of the electrical component 1 or integrated circuit 1. The latter usually also has a mark, which is designated by the reference numeral 27 in FIG. 2. The position of the integrated circuit is correct, in the exemplary embodiment shown, when the two marks 22, 27 are opposite one another.

The support part 7 is preferably made of an epoxy material or of a thermoplastic synthetic material. It may be stamped out of a slab-shaped material, milled, and bored, or it may be made as a plastic injection-molded part.

Furthermore, it is likewise conceivable to dispose a cooling body on the top of the electrical component 1, the holding-down device 16 then pressing on the cooling body, and through the latter's pressure on the top end face of the electrical component 1, this last being simultaneously pressed down on the support part 7. In this way, faultless heat transmission may be realized between the electrical component 1 and the cooling body.

Although not shown in the figures, a cooling body as just described may be provided for the aforesaid exemplary embodiment, as also for all further exemplary embodiments.

In FIGS. 5, 6, 7, and 8, a second exemplary embodiment of the contact arrangement according to the invention is shown. It essentially differs from the first exemplary embodiment in the formation of the compressible contact element 5, which is disposed in the space between the free end of the contact pin 3 facing the electrical component 1 and the terminal contact 6 facing the contact pin 3. This compressible contact element 5 comprises essentially a mat of silicone rubber having a thickness of about 0.3 to 1 mm. Disposed in the silicone rubber approximately at right angles to the plane defined by the mat are thin metal wires, preferably gold-plated wires. The individual little wires are spaced about 0.05 to 0.1 mm from one another. They are cut off approximately flush with the underside and the upper side of the mat. Such mats are commercially known and can, for example, be procured through the Japanese firm SHIN-ETSU. The firm indicates that these mats are suitable, for example, for electrically connecting electronic parts to conductor paths of a printed circuit board without a soldered joint.

In the exemplary embodiment shown, the plate-shaped support part 7 comprises essentially two superimposed plates 33, 34. The compressible mat 5 is disposed between the two plates. The fine wires which are disposed in the compressible mat 5 and which extend from the lower plate 33 to the upper plate 34 are marked with the reference numeral 10. The two superimposed plates are joined to one another in a suitable manner. They may be screwed together, held together by means of clamps, riveted, or held together in any other way. The mat 5 extends across all the bores 13. The contact pins 3 are pressed into the bores 13 of the lower plate 33, as previously described, and are contiguous with the underside of the lower plate 33 by means of the stop ring 30. The free end of each contact pin 3, not intended for connection with the printed circuit board 2, is substantially flush with the upper side of the lower plate 33. Preferably, it projects just a little from the bore 13. The end of the contact pin 3 which abuts the mat 5 is formed in such a way that contact-making takes place with as large a number of the thin wires 10 as possible. Simultaneously, it is also achieved that the end of the contact pin 3 can be pressed into the adjacent side of the mat without too great a force having to be mustered. This has led to the result that the end of the contact pin 3, as is shown by the reference numeral 12, is either made as a multitoothed crown having relatively blunt teeth, or that the end face of the contact pin is slightly dished, the dish rim forming a not too sharp-edged annulus.

The substantially dome-shaped terminal contact 6 rests on the other side of the compressible or elastic mat 5. The electrical connection between the terminal contact 6 and the associated contact pin 3 takes place through the pressing-down of the electrical component 1 by the holding-down device 16, as has already been described previously. At least one, but preferably a plurality of the fine little wires 10, thereby reliably establish an electrical connection between the terminal contact 6 and the end of the contact pin 3. The bores 13 of the upper plate 34 serve merely to guide the terminal contacts 6 of the electrical component 1. The upper plate 34 is therefore made thinner than the lower plate 33.

Figure 9:
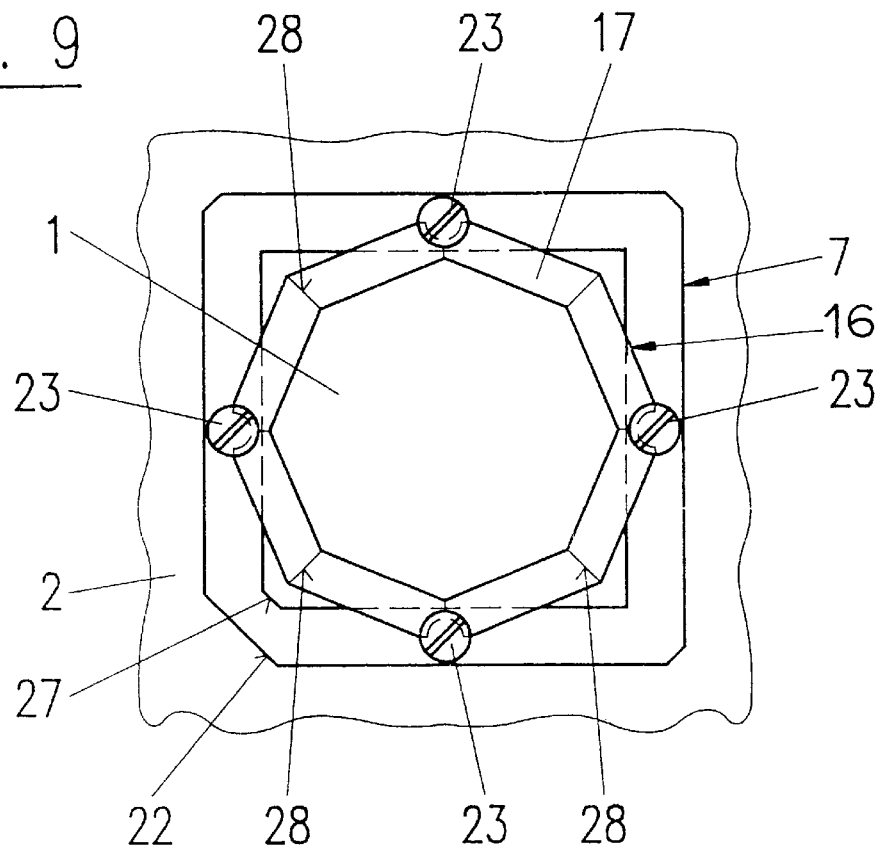
FIG. 9 shows a top plan view of a spring holding-down device which is usable on both exemplary embodiments of the contact arrangement.

In FIG. 9, the holding-down device 16 is formed as a spring. The latter is designed in this case as an approximately rectangular ring, the corners of the ring being raised and each projecting in the mounted state under a respective screw head of a fastening screw 23. From each corner of the ring, about two legs extend obliquely downward at an angle of about 45°, the junctions of each two legs meeting from adjacent corners forming a pressure point designated as 28 by which the electrical component 1 is pressed down on the holding part 7. In the exemplary embodiment shown, there is one pressure point 28 between each two fastening screws. Essentially, therefore, the spring comprises four spring pressure means 17, each pressure means pressing on a corner region of the electrical component 1. Depending on how far the fastening screws 23 are screwed into the support part 7 or into the printed circuit board 2, the spring force of the holding-down device 16 can be adjusted.

Of course, the holding-down device 16 formed as a pressure spring in FIG. 9 can also take other forms or be disposed otherwise. The holding-down device shown might also be mounted in such a way that the pressure means 17 press on the electrical component 1 substantially about halfway along each longitudinal side. The fastening screws would then be disposed in the region of the corners of the component, i.e., the whole holding-down device would be turned by about 45° as compared with the exemplary embodiment shown. Furthermore, it can be provided, instead of the rectangular spring, to form the latter as a cross or in any other suitable shape. Instead of the spring pressing directly on the electrical component 1, a cooling body can, as already mentioned previously, be disposed between the spring and the component in this exemplary embodiment as well.

Figure 10:
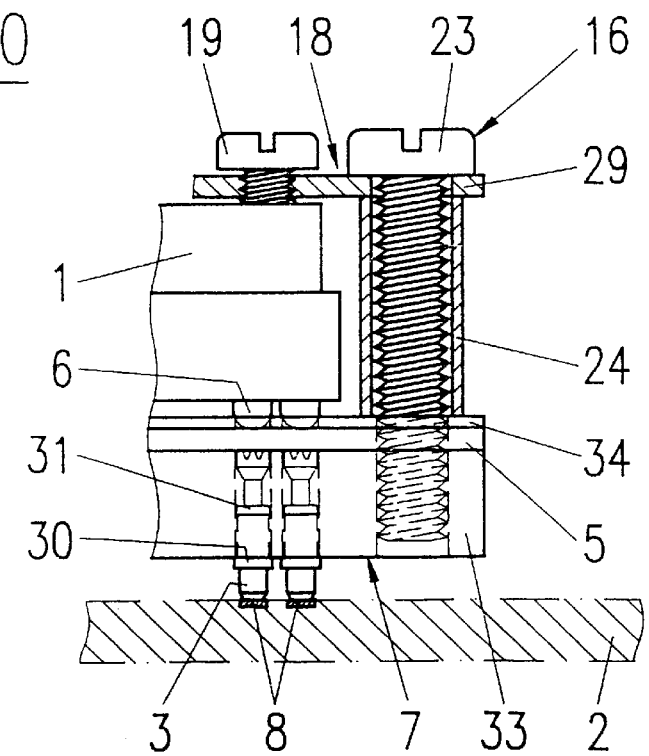
FIG. 10 shows an example of a further holding-down device having an adjustable holding-down force, which holding-own device is likewise usable on both exemplary embodiments of the contact arrangement.

In FIG. 10, a further holding-down device 16 is shown. This one comprises, like the first and second exemplary embodiments, four holding-down elements, only one of which is shown and designated by the reference numeral 18 in FIG. 10. Depicted with the reference numeral 29 is a web plate which is clamped between the spacer 24 and the screw head of the fastening screw 23 and extends over the component 1. In the region of the outer edge of the electrical component 1, the web plate 29 has, for example, a tapped bore into which a setscrew 19 is screwed, the screw shank of this screw pressing the electrical component I down on the support part 7 more strongly or less strongly depending on the screwing-in depth. The setscrew is intended to be an adjustment means 19 for adjusting the holding-down force. In a modified exemplary embodiment, it might also be imagined that the web plate 29 spans the entire electrical component 1 and is held on the other side of the component in the same way as shown in FIG. 10. Beneath the web plate, a cooling body can be disposed, and the setscrew can press on the cooling body merely in the middle, for example, or there can be several setscrews along the web plate.

Instead of the web plate 29 shown or the strip-shaped web plate described, the latter can also be formed rectangular and be held by means of four fastening screws similarly to the preceding examples. It can comprise several adjusting screws, or it can rest directly on the electrical component 1 and serve additionally as a cooling body.

It is clear to every specialist that here, without the need of an inventive step, a multitude of embodiments may be found, all of which have the same effect and consequently fall under the claimed invention.

I claim:

1. Contact arrangement for detachably attaching an electrical component having a plurality of terminal contacts to a printed circuit board, comprising a support disposed between said electrical component and said printed circuit board and comprising a plurality of bores disposed like said terminal contacts, a number of electrically conductive contact pins which are directly attachable to the printed circuit board and in attached state extend away from the printed circuit board at about right angles, each of the contact pins being disposed in one of said bore and being connected to at least one conductor path of the printed circuit board for establishing an electrical connection, the contact pins are made in one piece, a space extending away in each of said bore from the free end of the contact pin between each contact pin and a therewith associated terminal contact of the assembled electrical component, and the space bridged by an axially compressible, electrically conductive contact element for establishing an electrical connection between the contact pin and the terminal contact of the electrical component.

2. Contact arrangement according to claim 1, wherein the electrical component is and integrated circuit.

3. Contact arrangement according to claim 1 or 2, wherein the compressible, electrically conductive contact element is a coil spring.

4. Contact arrangement according to claim 3, wherein the end of the contact pin pointing toward the terminal contact of the component has an extension onto which the coil spring can be pressed.

5. Contact arrangement according to claim 1, wherein said terminal contacts are disposed in a ball grid array (BGA).

6. Contact arrangement according to claim 1, wherein the compressible, electrically conductive contact element comprises an electrically insulating rubber-elastic mat in which there are a plurality of thin wires spaced close to one another and running in an axial direction to the contact pins.

7. Contact arrangement according to claim 6, wherein the mat extends at least over the entire area formed by the plurality of terminal contacts.

8. Contact arrangement according to claim 6 or 7, wherein the end of the contact pin facing the terminal contact of the component has a dish with a circular rim or a crown-shaped structure with several teeth.

9. Contact arrangement according to claim 7, wherein the end of the contact pin facing the terminal contact of the component has a dish with a circular rim or a crown-shaped structure with several teeth.

10. Contact arrangement according to claim 1, wherein the contact pins are formed as surface mounted device (SMD) part and are attached to the surface of the printed circuit board.

11. Contact according to claim 1, wherein said support is plate-shaped, and made made of an epoxy material or of a thermoplastic synthetic material, and wherein each contact pin projecting from said support on the side facing the printed circuit board, and the other end of each contact pin being disposed set back from the support part surface facing the electrical component.

12. Contact arrangement according to claim 11, wherein the plate-shaped support part comprises two superimposed plates, the met being disposed between the two plates.

13. Contact arrangement according to claim 11 or 12, wherein the contact pins are pressed into the bored of the support part.

14. Contact arrangement according to claim 11, wherein the end region of each bore of the support part facing the component is formed as a guide means for the terminal contact of the electrical component associated with the respective bore.

15. Contact arrangement according to claim 11, wherein in that there is a holding-down device for pressing the terminal contacts of the component down on the compressible, electrically conductive contact element, which device is fixed to the support part or to the printed circuit board and has a pressure means which presses at at least one location upon the top surface of the component remote from the printed circuit board.

16. Contact arrangement according to claim 15, wherein the holding-down device comprises a spring pressing on the component.

17. Contact arrangement according to claim 15, wherein the holding-down device comprises at least one non-spring holding-down element which is connected to the support part on one side and presses upon the side of the component remote from the printed circuit board on the other side.

18. Contact arrangement according to claim 11, wherein the holding-down device comprises an adjustment means by which the holding-down pressure is adjustable.

19. Contact arrangement according to claim 11, wherein the distance from one edge of the support part to the nearest contact pin is at most 0.21 inch (5.2 mm).

20. Contact arrangement according to claim 11, wherein the contact pins inserted in the support part and the support part together form connector block, the maximum overall height of the connector block disposed on the printed circuit board amounting to at most 0.16 inch (4.1 mm).

21. Contact arrangement according to claim 1, wherein for positioning the component relative to the contact arrangement there are guide means resting against lateral faces of the component.

22. Contact arrangement for detachably attaching an electrical component having a plurality of terminal contacts to a printed circuit board comprising:

a plate-shaped support part, continuous bores in the support part, a number of electrically conductive contact pins which are directly attachable to the printed circuit board and in attached state extend away from the printed circuit board, each contact pin extends through one of the continuous bores in the support part, a free end of each contact pin being disposed set back from the support part surface facing the electrical component, forming a space extending between set free end of the contact pin and a therewith associated terminal contact of the assemble electrical component, and a compressible, electrically conductive contact element bridging the set space for establishing an electrical connection between the contact pin and the terminal contact of the electrical component.

* * * * *